(12) United States Patent
Johnson et al.

(10) Patent No.: US 7,820,275 B2
(45) Date of Patent: Oct. 26, 2010

(54) PHOTOCURABLE COMPOSITION FOR PRODUCING CURED ARTICLES HAVING HIGH CLARITY AND IMPROVED MECHANICAL PROPERTIES

(75) Inventors: David L. Johnson, The Woodlands, TX (US); Frank Tran, The Woodlands, TX (US); John Wai Fong, Temple City, CA (US)

(73) Assignee: Huntsman Advanced Materials Americas LLC, The Woodlands, TX (US)

( * ) Notice: Subject to any disclaimer, the term of this patent is extended or adjusted under 35 U.S.C. 154(b) by 1149 days.

(21) Appl. No.: 10/577,884

(22) PCT Filed: Nov. 4, 2004

(86) PCT No.: PCT/EP2004/052803

§ 371 (c)(1),
(2), (4) Date: Apr. 28, 2006

(87) PCT Pub. No.: WO2005/045523

PCT Pub. Date: May 19, 2005

(65) Prior Publication Data

US 2008/0182078 A1    Jul. 31, 2008

(51) Int. Cl.
*B32B 5/00* (2006.01)
(52) U.S. Cl. .................. 428/212; 427/510; 522/162
(58) Field of Classification Search .............. 428/212; 427/510; 522/162
See application file for complete search history.

(56) References Cited

U.S. PATENT DOCUMENTS

| | | | |
|---|---|---|---|
| 3,708,296 A | 1/1973 | Schlesinger | |
| 5,639,413 A | 6/1997 | Crivello et al. | |
| 6,251,557 B1 * | 6/2001 | Lapin et al. | 430/269 |
| 6,287,745 B1 * | 9/2001 | Yamamura et al. | 430/269 |
| 6,413,697 B1 | 7/2002 | Melisaris et al. | |
| 7,232,850 B2 * | 6/2007 | Johnson et al. | 522/100 |
| 2001/0046642 A1 | 11/2001 | Johnson | |
| 2002/0106584 A1 | 8/2002 | Lawton et al. | |
| 2003/0059708 A1 | 3/2003 | Yamamura et al. | |
| 2003/0104313 A1 | 6/2003 | Lawton | |

FOREIGN PATENT DOCUMENTS

| | | |
|---|---|---|
| EP | 0 646 580 | 4/1995 |
| EP | 0 831 127 | 3/1998 |
| EP | 0 837 366 A1 | 4/1998 |
| EP | 1 437 624 A1 | 7/2004 |
| WO | WO97/42549 | 11/1997 |
| WO | WO01/59524 | 8/2001 |
| WO | WO 03/089991 | 10/2003 |
| WO | WO2004/001507 | 12/2003 |

OTHER PUBLICATIONS

"UV-Curing, Science and Technology", Editor: S.P.Pappas, Technology Marketing Corp. 642 Westover Rd., Stamford, CT USA.
"Chemistry & Technology of UV & EB Formulations for Coatings, Inks, & Paints", vol. 3, Edited by P. K. T. Oldring.

* cited by examiner

*Primary Examiner*—David R Sample
*Assistant Examiner*—Lawrence D Ferguson

(57) ABSTRACT

A photocurable composition comprising: (a) a cationically curable component preferably formed from one or more epoxy compound(s), (b) an acrylate component having no or a low amount of hydroxy groups preferably dipentaerythritol hexaacrylate, (c) a polyol component, preferably a polyether polyol, (d) a cationic photoinitiator; and (e) a free radical photoinitiator. The composition may produce when cured three-dimensional articles with high clarity and improved mechanical properties.

13 Claims, No Drawings

PHOTOCURABLE COMPOSITION FOR PRODUCING CURED ARTICLES HAVING HIGH CLARITY AND IMPROVED MECHANICAL PROPERTIES

CROSS REFERENCE TO RELATED APPLICATIONS

This application is the National Phase of International Application PCT/EP2004/052803 filed Nov. 4, 2004 which designated the U.S. and which claims priority to U.S. patent application Ser. No. 10/704,520 filed Nov 6, 2003, and Ser. No. 10/751,330 filed Jan. 2, 2004. The noted applications are incorporated herein by reference.

FIELD OF THE INVENTION

The present invention relates to a photocurable composition which is particularly suitable for the production of three-dimensional articles, to processes for the production of a cured article and, in particular, for the production of a three-dimensional article from this composition having high clarity and improved mechanical properties.

BACKGROUND OF THE INVENTION

Three-dimensional articles produced from conventional hybrid compositions (a composition with both cationically curable and free radically curable compounds) by rapid prototyping techniques (e.g. stereolithography) tend to have low clarity. In particular, said articles may be hazy and/or be highly colored. This haziness is likely due, in larger part, to poor miscibility of the cationically curable and free radically curable compounds, which is accentuated by their different rates of reaction. It is well-known that cationically curable compounds cure slower than free radically curable compounds. In addition, conventional compositions containing certain aromatic acrylates or vinyl ethers, or high concentrations of photoacids, tend to produce colored articles. US 2002/0106584 A1 describes compositions to prepare polypropylene-like articles. Examples show compositions typically containing epoxy compounds, from 18 to 25% by weight of acrylate compounds and hydroxy polycarbonate diol or polytetrahydrofuran polyol. US 2003/0059708 describes photocurable resin compositions containing preformed copolymer and elastomeric particles to form 3D objects free from residual bubbles and having high impact strength.

WO 01/59524 and corresponding US 2001/0046642 describe a liquid, radiation-curable composition which is free from radical photoinitiator. The exemplified compositions all contain polyester polyols.

WO 97/42549 and corresponding U.S. Pat. No. 6,251,557 describe a photosensitive resin composition containing an epoxy resin having aromatic groups and being solid at room temperature, especially a bisphenol A epoxy resin, and an other, liquid epoxy resin, to form 3D articles exhibiting good mechanical properties upon cure. The compositions further contain polyester polyols as caprolactone triol.

EP 0831127 describes stereolithographic resin composition containing thermoplastic polymer compound which is said to mix within the resin composition at room temperature.

WO 2004/001507 is focused on curable compositions containing a benzophenone initiator. The compositions further contain Uvacure 1500 (epoxy compound), SR 399 (monohydroxy dipentaerythritol pentaacrylate), triarylsulfonium hexafluoroantimonate salt.

EP 0837366 A1 describes compositions containing cyclohexene oxide epoxy compound, hydrogenated bisphenol A diglycidyl ether, trimethylolpropane triacrylate, hydroxycyclohexyl phenyl ketone, propylene oxide adduct glycerin.

EP 1437624 A1 describes stereolithographic resins containing selected oxetane compounds. All compositions further contain dipentaerythritol-monohydroxy pentaacrylate SR 399 from Sartomer.

Today, there is a growing need for rapid prototyping materials and processes that produce three-dimensional articles with high clarity as well as improved mechanical properties. For example, manufacturers of end products having a visual aspect, such as computer monitors, portable telephones and televisions, find high clarity resins especially useful.

Early attempts to meet this need focused on using starting materials that contain little or no color. However, this approach proved unsatisfactory because color comes not only from the starting materials but also from the photocuring process itself. Other attempts to improve clarity have relied on removing polyols from the photocurable composition, yet this approach is unsatisfactory because such compositions tend to produce brittle parts.

A continueing need and challenge is to obtain highly transparent cured objects which moreover have very good mechanical properties of tensile strength, modulus, elongation etc.

The type of transparency required relates to both non-haze and no visible colour: ie non-coloured and optically clear objects are sought. To achieve these optical properties, components in a resin mix have to be chosen to be totally compatible and not contain groups [eg aromatics] which can lead to yellowing.

Hybrid resin compositions made up of epoxy, acrylic and 'tougheners', eg polyols, all containing certain amounts of hydroxy content are well established in the stereolithography field as providing a good balance of the required mechanical properties. These tend though to 'yellow' or become opaque with time.

To achieve stable transparency, we need to find suitable component mixes which start off as completely miscible and with no yellow colouration, and which, after the stereolithography or other curing process to consolidate the resin, result in cured objects which also are highly clear and non-coloured.

The present invention relates to a photocurable composition that is especially useful for producing three-dimensional articles with high clarity and improved mechanical properties and thus improved end uses.

SUMMARY OF THE INVENTION

It has been found that certain compositions of epoxy and acrylic components provide these desired characteristics.

In the past, resin mixes have involved cycloaliphatic epoxies ['alicyclic epoxies', with an oxirane ring attached to an aliphatic ring] and aliphatic epoxies [eg glycidyls] and hydroxy-containing acrylic components. The hydroxy group in the acrylic help to compatibilise the acrylic component with the polar epoxy content and thus achieve transparent resin mixes.

Non-hydroxy containing acrylic components were thought not to be not readily compatible with the epoxy component, when seeking highly transparent hybrid mixes.

Unusually it has been found that non-, or low-hydroxy content acrylics are compatible with epoxy compounds, especially used in less that 20% by wt wrt to total composition. Such acrylics, particularly derived from aliphatic residues, provide also non-yellowing cured parts.

It has also been found that particularly favoured are those compositions with no-, or low-amounts of aliphatic epoxy [eg glycidyl-] in the total epoxy content. Reduction or removal of the glycidyl component gives both optical clarity and non-yellowing properties [the yellowing from glycidyl component will be apparent if using aromatic containing glycidyl materials, based eg on bis-phenol A residues]. It is believed that the glycidyl component being less reactive than the cycloaliphatic epoxy in cationically polymerised compositions, becomes incompatible and leads to less optical clarity.

An hydroxy containing compound different from the non- or low-hydroxy content acrylic is also present in the composition. Polyester polyol often used tends to give high tensile strengths, but low elongation/toughness. Polyether polyol are preferred because they may give flexibility [ie ~15 to 20% elongation necessary for snap fit applications], & toughness [Izod impact of 0.8 ft Ib/inch].

The present invention provides a photocurable composition comprising following components:
(a) an epoxy component containing one or more epoxy compound(s);

with from 0 to less than 30% preferably to less than 28% more preferably to less than 20% by weight of the epoxy component being of glycidyl type,
(b) a (meth)acrylate component containing one or more multifunctional (meth)acrylates which:
  (i) contain no hydroxyl groups; or
  (ii) contain hydroxyl groups, but have a hydroxyl equivalent weight of 500 grams or less, preferably a hydroxyl equivalent weight of about 300 grams or less; and preferably the (meth)acrylate component forms less than 20% by weight of the total composition,
(c) a component containing two or more hydroxyl groups, being preferably not a polyester compound, being preferably not an acrylated polyol, and preferably is a polyether polyol compound
(d) a cationic photoinitiator; and
(e) a free radical photoinitiator.

The present invention also provides a photocurable composition comprising following components:
(a) a cationically curable component preferably formed from one or more epoxy compound(s)
(b) an acrylate component containing, preferably formed from, dipentaerythritol hexaacrylate,
(c) a polyol component comprising a polyol compound containing two or more hydroxyl groups, preferably polyther polyol,
(d) a cationic photoinitiator; and
(e) a free radical photoinitiator.

In yet another aspect, there is provided a process for producing a three dimensional article in sequential cross-sectional layers in accordance with a model of the article, the process comprising the steps of:
(1) forming a first layer of the photocurable composition of the present invention;
(2) exposing said first layer to actinic radiation in a pattern corresponding to a respective cross-sectional layer of the model sufficient to harden the first layer in the imaged area;
(3) forming a second layer of said composition above the hardened first layer;
(4) exposing said second layer to actinic radiation in a pattern corresponding to a respective cross-sectional layer of the model sufficient to harden the second layer in the imaged area; and
(5) repeating steps (3)-(4) to form successive layers as desired to form said three dimensional article.

In a further aspect, there is provided a process for forming a three-dimensional article in sequential cross-sectional layers in accordance with a model of the article, the process comprising the steps of: depositing droplets of the photocurable composition of the present invention onto a substrate in a pattern corresponding to a cross-sectional layer of the model so that adjacent droplets merge together; repeating these steps to form successive layers; and applying actinic radiation to cure the photocurable composition, pixel-to-pixel, line-by-line, layer-by-layer, after several layers have been formed and/or after all desired layers have been formed.

Depositing droplets process can be an extrusion-type process or, preferably distinct droplets are deposited by piezo devices, especially by ink-jet processes.

The present invention also provides a photocurable composition comprising (a) a cationically curable compound; (b) one or more multifunctional (meth)acrylates characterized in that said (meth)acrylates (i) contain no hydroxyl groups; or (ii) contain hydroxyl groups, but have a hydroxyl equivalent weight of 500 grams or less; (c) a compound containing two or more hydroxyl groups that is different from (b)(ii); (d) a cationic photoinitiator; and (e) a free radical photoinitiator. A "multifunctional" (meth)acrylate is an acrylate or methacrylate having a functionality of three or higher.

The invention also provides a photocurable composition comprising following components:
(a) a cationically curable component preferably formed from one or more epoxy compound(s)
(b) a (meth)acrylate component containing alkoxylated acrylate, preferably a trimethylolpropane ethoxylated triacrylate, preferably the (meth)acrylate component forms less than 20% by weight of the total composition,
(c) a polyol component comprising a polyol compound containing two or more hydroxyl groups, preferably polyether polyol,
(d) a cationic photoinitiator; and
(e) a free radical photoinitiator.

The invention further provides a photocurable composition comprising following components:
(a) a cationically curable component preferably formed from one or more epoxy compound(s)
(b) a (meth)acrylate component containing pentaerythritol triacrylate, the (meth)acrylate component forming preferably less than 20% by weight of the total composition,
(c) a polyol component comprising a polyol compound containing two or more hydroxyl groups, preferably polyether polyol,
(d) a cationic photoinitiator; and
(e) a free radical photoinitiator.

In another aspect, the invention provides a photocurable composition comprising (a) a cationically curable compound; (b) one or more multifunctional (meth)acrylates characterized in that said (meth)acrylates (i) contain no hydroxyl groups; or (ii) contain hydroxyl groups, but have a hydroxyl equivalent weight of 500 grams or less; (d) a cationic photoinitiator; and (e) a free radical photoinitiator.

DETAILED DESCRIPTION OF THE INVENTION

The composition of the present invention produces three-dimensional articles with high clarity and improved mechanical properties.

Cationically Curable Compound

The cationically curable compound of the present invention preferably comprises an epoxy component formed from or containing at least one epoxy compound.

An epoxy compound is a compound in which an oxygen atom is directly attached to two adjacent or non-adjacent carbon atoms of a carbon chain or ring system; thus a cyclic ether (IUPAC definition). Epoxides, also called oxirane, represents a subclass of epoxy compounds containing a saturated three-membered cyclic ether. Preferred epoxy compounds are cycloaliphatic epoxides wherein the epoxy group is incorporated into an aliphatic cycle, preferably a 5 or 6-membered cycle. The epoxy component can contain oxetane and epoxide compounds. Preferably the epoxy component contains low or no glycidyl epoxy compounds which are thought to be of less reactivity.

These epoxies may be linear, branched, or cyclic in structure. For example, there may be included one or more epoxide compounds in which the epoxide groups form part of an alicyclic or heterocyclic ring system. Others include an epoxy-containing compound with at least one epoxycyclohexyl group that is bonded directly or indirectly to a group containing at least one silicon atom. Examples are disclosed in U.S. Pat. No. 5,639,413, which is incorporated herein by reference. Still others include epoxides which contain one or more cyclohexene oxide groups and epoxides which contain one or more cyclopentene oxide groups.

Particularly suitable non-glycidyl epoxies include epoxide compounds in which the epoxide groups form part of an alicyclic or heterocyclic ring system such as bis(2,3-epoxycyclopentyl)ether, 2,3-epoxycyclopentyl glycidyl, ether, 1,2-bis(2,3-epoxycyclopentyloxy)ethane, bis(4-hydroxycyclohexyl)methane diglycidyl ether, 2,2-bis(4-hydroxycyclohexyl)propane diglycidyl ether, 3,4-epoxycyclohexyl methyl 3,4-epoxycyclohexanecarboxylate, 3,4-epoxy-6-methyl-cyclohexymethyl 3,4-epoxy-6-methyl-cyclohexanecarboxylate, di(3,4-epoxycyclohexylmethyl) hexanedioate, di(3,4-epoxy-6-methylcyclohexylmethyl)hexanedioate, ethylenebis(3,4-epoxycyclohexane-carboxylate, ethanediol di(3,4-epoxycyclohexylmethyl)ether, vinylcyclohexene dioxide, dicyclopentadiene diepoxide or 2-(3,4-epoxycyclohexyl-5,5-spiro-3,4-epoxy)cyclohexane-1,3-dioxane. Highly preferred non-glycidyl epoxies are difunctional cycloaliphatic non-glycidyl epoxies, such as 3,4-epoxycyclohexylmethyl 3,4-epoxycyclohexanecarboxylate and 3,4-epoxycyclohexylmethyl 3,4-epoxycyclohexylcarboxylate, with the former being the most preferred.

One of skill in the art will appreciate that some aromatic epoxies tend to produce colored parts, e.g., phenyl and cresol novolaks. Therefore, some aromatic epoxies will not be suitable for inclusion in the composition of this invention, especially if included in high concentrations. Preferably the epoxy component contains no aromatic epoxies or at most 10% by weight of the epoxy component and/or at most 5% by weight with regard to the total composition.

The photocurable composition of the present invention may include one or more glycidyl epoxies such as polyglycidyl ethers, poly(β-methylglycidyl)ethers, polyglycidyl esters, poly (β-methylglycidyl) esters, poly(N-glycidyl) compounds, and poly(S-glycidyl) compounds, provided that they are included in low concentration. One of skill in the art will appreciate that glycidyl epoxies tend to produce colored articles, which is not suitable for the present invention. Preferably the composition contains no or at most 20% by weight wrt epoxy component of glycidyl epoxy compound(s). More preferably the composition contains no or at most 20% by weight wrt epoxy component of aromatic glycidyl epoxy compound(s).

It is also possible to employ epoxy resins in which the 1,2-epoxide groups are attached to different heteroatoms or functional groups. Examples of these compounds include the N,N,O-triglycidyl derivative of 4-aminophenol, the glycidyl ether/glycidyl ester of salicylic acid, N-glycidyl-N'-(2-glycidyloxypropyl)-5,5-dimethylhydantoin or 2-glycidyloxy-1,3-bis(5,5-dimethyl-1-glycidylhydantoin-3-yl)propane.

Also conceivable is the use of liquid prereacted adducts of epoxy resins, such as those mentioned above, with hardeners for epoxy resins.

Solid epoxy compounds are preferably avoided.

Examples of cationically polymerizable organic substances other than epoxy resin compounds include oxetane compounds, such as trimethylene oxide, 3,3-dimethyloxetane and 3,3-dichloromethyloxetane, 3-ethyl-3-phenoxymethyloxetane, and bis(3-ethyl-3-methyloxy)butane; oxolane compounds, such as tetrahydrofuran and 2,3-dimethyl-tetrahydrofuran; cyclic acetal compounds, such as trioxane, 1,3-dioxalane and 1,3,6-trioxan cycloctane; cyclic lactone compounds, such as β-propiolactone and ε-caprolactone. Among the above mentioned non epoxy compounds, oxetane compounds are preferred. Other cationically curable compounds include spiro ortho esters that are prepared by reacting epoxy compounds with lactone, ethylenically unsaturated compounds, such as vinyl cyclohexane, n-vinyl-2-pyrrolidone and its various derivatives, isobutylene and polybutadiene, and derivatives of the above compounds.

One of skill in the art will appreciate that vinyl ethers tend to produce colored parts. Accordingly, some vinyl ethers will not be suitable for inclusion in the composition of this invention, especially if included in high concentrations.

The above cationically polymerizable compounds may be used alone or as a mixture of two or more thereof depending upon the desired performance.

Multifunctional (Meth)acrylate

The multifunctional (meth)acrylate component preferably comprises one or more multifunctional (meth)acrylates, for example, tri-, tetra-, penta or higher functional monomeric or oligomeric, aliphatic or cycloaliphatic (meth)acrylates characterized in that said (meth)acrylates (i) contain no hydroxyl groups; or (ii) contain hydroxyl groups, but have a hydroxyl equivalent weight of 500 grams or less.

A particularly preferred multifunctional (meth)acrylate (b) (i) of the present invention has a hydroxyl equivalent weight of 300 grams or less. Pentaerythritol triacrylate (available as SR® 444 from Sartomer) being the especially preferred.

Highly preferred multifunctional (meth)acrylates include pentaerythritol (meth)acrylates. "Pentaerythritol methacrylate" is an acrylate, a methacrylate, or a mixture thereof, of an alcohol that has been prepared by reacting methacrylic acid with the alcohol, pentaerythritol. More preferable still are pentaerythritol (meth)acrylates with no hydroxyl group, such as pentaerythritol tetraacrylate. Especially preferred are dipentaerythritol (meth)acrylates, such as dipentaerythritol hexaacrylate. "Dipentaerythritol methacrylate" is an acrylate, a methacrylate, or a mixture thereof, of an alcohol that has been prepared by reacting methacrylic acid with the alcohol, dipentaerythritol.

Also preferred are alkoxylated acrylates having no hydroxyl group, such as ethoxylated trimethylolpropane triacrylate (e.g., SR® 499 available from Sartomer). Another ethoxylated trimethylolpropane is ethoxylated (3) trimethylolpropane triacrylate (SR 354 from Sartomer). Also preferred is pentaerythritol triacrylate (SR 444 available from Sartomer).

Examples of suitable aliphatic poly(meth)acrylates having more than two unsaturated bonds in their molecules are the triacrylates and trimethacrylates of hexane-2,4,6-triol, glycerol or 1,1,1-trimethylolpropane, ethoxylated or propoxylated glycerol or 1,1,1-trimethylolpropane, and the hydroxyl-containing tri(meth)acrylates which are obtained by reacting triepoxide compounds, for example the triglycidyl ethers of said triols, with (meth)acrylic acid. It is also possible to use, for example, pentaerythritol tetraacrylate or ditrimethylolpropane tetraacrylate.

It is additionally possible, for example, to use polyfunctional urethane acrylates or urethane methacrylates. These urethane (meth)acrylates are known to the person skilled in the art and can be prepared in a known manner by, for example, reacting a hydroxyl-terminated polyurethane with acrylic acid or methacrylic acid, or by reacting an isocyanate-terminated prepolymer with hydroxyalkyl (meth)acrylates to give the urethane (meth)acrylate.

The (meth)acrylates used herein are known compounds and some are commercially available, for example from the SARTOMER Company under product designations such as SR®295 (pentaerythritol tetraacrylate), SR®350 (trimethylolpropane trimethacrylate), SR®351 (trimethylolpropane triacrylate), SR®355 (di-trimethylolpropane tetraacrylate), SR®367, SR®444 (pentaerythritol triacrylate), SR®454 (ethoxylated (3) trimethylolpropane triacrylate) or SR®499 (ethoxylated (6) trimethylolpropane triacrylate).

In addition to the select multifunctional (meth)acrylates described above, the inventive composition may further comprise di(meth)acrylates. Examples of di(meth)acrylates are the di(meth)acrylates of cycloaliphatic diols such as 1,4-dihydroxymethylcyclohexane, 2,2-bis(4-hydroxy-cyclohexyl) propane, bis-(hydroxycyclohexyl)methane, Bisphenol A, Bisphenol S, ethoxylated or propoxylated Bisphenol A, or ethoxylated or propoxylated Bisphenol S. Di(meth)acrylates of this kind are known and some are commercially available, e.g. CN® 120 (Bisphenol-A epoxy diacrylate), which is particularly preferred.

Alternatively, the di(meth)acrylate may be acyclic aliphatic. Di(meth)acrylates of this kind are known. Examples include compounds of the formulae (F-I) to (F-IV)) of U.S. Pat. No. 6,413,697, herein incorporated by reference. Further examples of possible di(meth)acrylates are compounds of the formulae (F-V) to (F-VIII) of U.S. Pat. No. 6,413,697. Their preparation is also described in EP-A-0 646 580. Some compounds of the formulae (F-I) to (F-VIII) are commercially available. Aliphatic di(meth)acrylates are preferred.

One of skill in the art will appreciate that some aromatic acrylates tend to produce colored parts. Therefore, some aromatic acrylates will not be suitable for inclusion in the composition of this invention, especially if included in high concentrations.

Hydroxyl-Containing Compound

The photocurable composition of the present invention may contain one or more compounds containing two or more hydroxyl groups. Preferably this compound is different from the acrylate compound b(ii). Preferably the hydroxyl-containing compound has no acrylate functionalities. Preferably this hydroxyl-containing compound has a molecular weight of 1500 grams or less. More preferably, this compound is a polyether polyol. Particularly preferred polyether polyols include propoxylated glycerine, which has a molecular weight of about 260. Other suitable compounds containing two or more hydroxyl groups for the present invention include polytetramethylene ether glycol ("poly THF") and CHDM (1,4-cyclohexanedimethanol). Polytetramethylene ether glycols are commercially available in the Polymeg® line (Penn Specialty Chemicals).

Photoinitiators

The cationic and free radical photoinitiators are added in effective quantities, i.e. in quantities from 0.1 to 12, particularly from 0.5 to 9 percent by weight, based on the overall quantity of the composition. One of skill in the art will appreciate that high concentrations of photoacids tend to produce colored articles. If the novel compositions are used for stereolithographic processes, in which laser beams are normally employed, it is essential for the absorption capacity of the composition to be matched, by way of the type and concentration of the photoinitiators, in such a way that the depth of curing at normal laser rate is from approximately 0.1 to 2.5 mm.

The novel mixtures may also contain various photoinitiators of different sensitivity to radiation of emission lines with different wavelengths to obtain a better utilization of a UV/VIS light source which emits emission lines of different wavelengths. In this context it is advantageous for the various photoinitiators to be selected such, and employed in a concentration such, that equal optical absorption is produced with the emission lines used.

Cationic Photoinitiator

It is possible to employ a host of known and industrially tried and tested cationic photoinitiators for cationic polymerization. Examples of these photoinitiators are onium salts with anions of weak nucleophilicity. Examples thereof are halonium salts, iodosyl salts or sulfonium salts, sulfoxonium salts, or diazonium salts, as described for example in U.S. Pat. No. 3,708,296. Other cationic photoinitiators are metallocene salts.

An overview of further commonplace onium salt initiators and/or metallocene salts is offered by "UV-Curing, Science and Technology", (Editor: S. P. Pappas, Technology Marketing Corp., 642 Westover Road, Stamford, Conn., USA) and "Chemistry & Technology of UV & EB Formulations for Coatings, Inks & Paints", Vol. 3 (edited by P. K. T. Oldring), each of which is incorporated herein by reference.

Preferred commercial cationic photoinitiators are UVI-6976, UVI-6974, UVI-6970; UVI-6960, UVI-6990 (manufactured by Union Carbide Corp.), CD-1010, CD-1011, CD-1012 (manufactured by Sartomer Corp.), Adekaoptomer SP-150, SP-151, SP-170, SP-171 (manufactured by Asahi Denka Kogyo Co., Ltd.), Irgacure 261 (Ciba Specialty Chemicals Corp.), CI-2481, CI-2624, CI-2639, CI-2064 (Nippon Soda Co, Ltd.), DTS-102, DTS-103, NAT-103, NDS-103, TPS-103, MDS-103, MPI-103, BBI-103 (Midori Chemical Co, Ltd.). More preferred are UVI-6976, UVI-6974, CD-1010, UVI-6970, Adekaoptomer SP-170, SP-171, CD-1012, and MPI-103. The most preferred is UVI-6976, which is a mixture of S,S,S,S$^1$-Tetraphenylthiobis (4,1-phenylene)disulfonium dihexafluoro antimonate and diphenyl (4-phenylthiophenyl)sulfonium hexafluoroantimonate.

Highly preferred photocurable compositions of the present invention comprise a low concentration of photoacid, i.e., the acid catalyst that is formed when the cationic photoinitiator is exposed to UV light, which consequently starts the cationic chemical reaction.

The above-mentioned cationic photoinitiators can be used either individually or in combination of two or more.

Free Radical Photoinitiator

It is possible to employ all types of photoinitiators which form free radicals given the appropriate irradiation. Typical representatives of free-radical photoinitiators are benzoins, such as benzoin, benzoin ethers, such as benzoin methyl ether, benzoin ethyl ether and benzoin isopropyl ether, benzoin phenyl ether and benzoin acetate, acetophenones, such as acetophenone, 2,2-dimethoxy-acetophenone and 1,1-dichloroacetophenone, benzil, benzil ketals, such as benzil dimethylketal and benzil diethyl ketal, anthraquinones, such as 2-methylanthraquinone, 2-ethylanthra-quinone, 2-tert-butylanthraquinone, 1-chloroanthraquinone and 2-amylanthraquinone, and also tri-phenylphosphine, benzoylphosphine oxides, for example 2,4,6-trimethylbenzoyl-diphenylphosphine oxide (Luzirin® TPO), bisacylphosphine oxides, benzophenones, such as benzophenone and 4,4'-bis (N,N'-dimethylamino)benzophenone, thioxanthones and xanthones, acridine derivatives, phenazine derivatives, quinoxaline derivatives or 1-phenyl-1,2-propanedione 2-O-benzoyl oxime, 1-aminophenyl ketones or 1-hydroxy phenyl ketones, such as 1-hydroxycyclohexyl phenyl ketone, phenyl 1-hydroxyisopropyl ketone and 4-isopropylphenyl 1-hydroxyisopropyl ketone.

Preferably, the free radical photoinitiator is a cyclohexyl phenyl ketone. More preferably, the cyclohexyl phenyl ketone is a 1-hydroxy phenyl ketone. Most preferably the 1-hydroxy phenyl ketone is 1-hydroxcyclohexyl phenyl ketone, e.g., Irgacure 184 (Ciba Specialty Chemicals).

Other Components

The photocurable composition of the present invention may also contain one or more stabilizers. Preferred stabilizers are Tinuvin 144 (Bis (1,2,2,6,6-pentamethyl-4-piperidyl) [[3,5-bis(1,1-dimethylethyl)-4-hydroxyphenyl]methyl]butyl-malonate), Tinuvin 900 (2-(2H-Benzotriazol-2-yl)-4,6-bis(1-methyl-1-phenylethyl)phenol), and hindered amines, e.g., benzyl dimethyl amine ("BDMA"), N,N-Dimethylbenzylamine.

The photocurable composition of the present invention is formulated so as to enable the production of cured articles having high clarity and improved mechanical properties. For example, articles made from said composition have a yellow index/inch value of less than 80 and yet also have high flex modulus, high heat deflection temperature, and high water resistance.

Components Percentages

Preferably, the composition comprises about 55 to about 85 percent by weight of component (a), preferably about 60 to 70%. Preferably the composition contains about at least 4% by weight of component (b). Preferably the composition contains at most about 30%, 29%, 28%, 27%, 26%, 25%, 24%, 23%, 22%, 21%, 20% by weight of component (b). Preferably, the composition contains about 0.05 to about 12%, preferably about 0.01 to about 10% preferably about 0.1 to about 8%, preferably 0.15 to about 5.5% percent by weight of component (c). Preferably the photocurable composition comprises about 60 to about 70 percent by weight of component (a), about 8 to less than 20 percent by weight of component (b) about 0.15 to about 5.5 percent by weight of component (c), and about 0.4 to about 3 percent by weight of component (d). Preferably, the photocurable composition comprises about 55 to about 85 percent by weight of component (a), about 4 to about 30 percent by weight of component (b), about 0.05 to about 12 percent by weight of component (c), about 0.01 to about 10 percent by weight of component (d), and about 5 to about 40 percent by weight of component (e). More preferably, the photocurable composition comprises about 55 to about 75 percent by weight of component (a), about 7 to about 30 percent by weight of component (b), about 0.1 to about 8 percent by weight of component (c), about 0.3 to about 5 percent by weight of component (d), and about 10 to about 25 percent by weight of component (e). More preferably, the photocurable composition comprises about 60 to about 70 percent by weight of component (a), about 8 to about 20 percent by weight of component (b), about 0.15 to about 5.5 percent by weight of component (c), about 0.4 to about 3 percent by weight of component (d), and about 10 to about 15 percent by weight of component (e).

Preferably the composition does not comprise multifunctional (meth)acrylates other than those defined by component (b). Preferably the composition does not comprise polyol compounds other than the polyether polyol forming component (c).

Other Components

The photocurable composition of the present invention may also contain one or more stabilizers. Preferred stabilizers are Tinuvin 144 (Bis (1,2,2,6,6-pentamethyl-4-piperidyl)[[3,5-bis(1,1-dimethylethyl)-4-hydroxyphenyl]methyl]butyl-malonate), Tinuvin 900 (2-(2H-Benzotriazol-2-yl)-4,6-bis(1-methyl-1-phenylethyl)phenol), and hindered amines, e.g., benzyl dimethyl amine ("BDMA"), N,N-Dimethylbenzylamine.

The photocurable composition preferably does not contain components leading to hazy or opaque articles after cure hereafter called opacifying components, such as compounds non miscible in the composition or solid compounds. Examples of such opacifying components are:
- high molecular weight compounds such as polymers or resins such as those having a M. W. of 5000 or more or 10000 or more,
- compounds in solid form, for example polymer particles such as elastomeric particles,
- non miscible or non mixable compounds such as for example polyether sulfone.

The photocurable composition of the present invention is formulated so as to enable the production of cured articles having high clarity and improved mechanical properties. For example, articles made from said composition have a yellow index/inch value of less than 80 and yet also have high flex modulus, high heat deflection temperature, and high water resistance.

In principle, any stereolithography machine may be used to carry out the inventive method. Stereolithography equipment is commercially available from various manufacturers. Table I lists examples of commercial stereolithography equipment available from 3D Systems Corp. (Valencia, Calif.).

TABLE I

Stereolithography Machines

| MACHINE | WAVELENGTH (nm) |
|---|---|
| SLA ® 250 | 325 |
| SLA ® 500 | 351 |

TABLE I-continued

Stereolithography Machines

| MACHINE | WAVELENGTH (nm) |
|---|---|
| SLA ® 3500 | 355 |
| SLA ® 5000 | 355 |
| SLA ® 7000 | 355 |
| Viper si2 ™ | 355 |

Those skilled in the art will appreciate that the various embodiments described above and in the experimental section that follow are meant to be exemplary, and that the invention may be practiced otherwise than as specifically described herein yet still within the scope of the claims and equivalents thereto.

EXAMPLES

The general procedure used for preparing three-dimensional articles with stereolithography equipment is as follows. The photocurable composition is placed in a vat designed for use with the stereolithography equipment. The photocurable composition is poured into the vat within the machine at about 30° C. The surface of the composition, either in its entirety or in accordance with a predetermined pattern, is irradiated with a UV/VIS light source so that a layer of a desired thickness is cured and solidified in the irradiated area. A new layer of the photocurable composition is formed on the solidified layer. The new layer is likewise irradiated over the entire surface or in a predetermined pattern. The newly solidified layer adheres to the underlying solidified layer. The layer formation step and the irradiation step are repeated until a green model of multiple solidified layers is produced.

A "green model" is a three-dimensional article initially formed by the stereolithography process of layering and photocuring, where typically the layers are not completely cured. This permits successive layers to better adhere by bonding together when further cured. "Green strength" is a general term for mechanical performance properties of a green model, including modulus, strain, strength, hardness, and layer-to-layer adhesion. For example, green strength may be reported by measuring flexural modulus (ASTM D 790). An object having low green strength may deform under its own weight, or may sag or collapse during curing.

The green model is then washed in tripropylene glycol monomethyl ether ("TPM") and subsequently rinsed with water and dried with compressed air. The dried green model is next postcured with UV radiation in a postcure apparatus ("PCA") for about 60-90 minutes.

"Postcuring" is the process of reacting a green model to further cure the partially cured layers. A green model may be postcured by exposure to heat, actinic radiation, or both.

Examples 1-9

Table 1 lists the components of each photocurable composition labeled as Examples 1-9. The numbers in Table 1 refer to the weight percent of each component based on the total weight of the photocurable composition. Table 2 provides further identifying information for the trade names in Table 1.

To those familiar with the art, it is understood that it is difficult to acrylate the final hydroxyl group of dipentaerythritol. We completed an analysis to verify the identity of the dipentaerythritol hexaacrylate ("DPHA") used in the experiments. The results are presented below. The absence of hydroxyl group in DPHA and the similarity of an IR spectra of DPHA and dipentaerythritol monohydroxypentaacrylate ("DPHPA") proved that the DPHA we were using was in fact dipentaerythritol hexaacrylate.

| Component | Reported Hydroxyl Value (mg KOH/g) | Calculated mol OH/mole monomer | Theoretical mol OH/mol monomer |
|---|---|---|---|
| DPHPA (SR 399, 578 g/mole) | 109.6 | 1.024 | 1.00 |
| DPHA (524 g/mole) | 7.6 | 0.078 | 0.0 |

TABLE 1

| | Example 1 (Comparative) | Example 2 | Example 3 (Comparative) | Example 4 | Example 5 | Example 6 | Example 7 (Comparative) | Example 8 | Example 9 |
|---|---|---|---|---|---|---|---|---|---|
| DER 332 | | | | | | 5.0 | 5.0 | 5.0 | 5.0 |
| ERL 4221D | 46.0 | 46.0 | 46.0 | 46.0 | 46.0 | | | | |
| Uvacure 1500 | | | | | | 58.0 | 58.0 | 58.0 | 58.0 |
| Heloxy 48 | 11.0 | 11.0 | 11.0 | 11.0 | 11.0 | | | | |
| Heloxy 84 | 6.0 | 6.0 | 6.0 | 6.0 | 6.0 | | | | |
| Arcol LG 650 | | | | | | 10.0 | 10.0 | 10.0 | 10.0 |
| CHDM | 5.0 | 5.0 | 5.5 | 5.5 | 5.5 | | | | |
| Polymeg 1000 | 10.0 | 10.0 | 9.5 | 9.5 | 9.5 | | | | |
| CN 120 | 9.0 | 9.0 | 9.0 | 9.0 | 9.0 | | | | |
| SR 9041 | 7.0 | | 7.0 | | | | | | |
| DPHA | | 7.0 | | | | 5.0 | | 5.0 | |
| SR 295 | | | | 7.0 | | | | | |
| SR 355 | | | | | 7.0 | | | | |
| SR 399 | | | | | | | 5.0 | | |
| SR 444 | | | | | | | | | 5.0 |
| SR 499 | | | | | | 15.0 | 15.0 | 15.0 | 15.0 |
| I-184 | 1.8 | 1.8 | 1.8 | 1.8 | 1.8 | 2.0 | 2.0 | 2.0 | 2.0 |

TABLE 1-continued

| | Example 1 (Comparative) | Example 2 | Example 3 (Comparative) | Example 4 | Example 5 | Example 6 | Example 7 (Comparative) | Example 8 | Example 9 |
|---|---|---|---|---|---|---|---|---|---|
| UVI 6976 | 4.2 | 4.2 | 4.2 | 4.2 | 4.2 | 5.0 | 5.0 | 5.0 | 5.0 |
| Crystal violet lactone (CVL) | | | | | | 0.00005 | 0.00005 | 0.00005 | 0.00005 |
| Tinuvin 144 | | | | | | | | 0.01 | 0.01 |
| Tinuvin 900 | | | | | | | | 0.01 | 0.01 |
| DY062 | 0.025 | 0.025 | 0.025 | 0.025 | 0.025 | 0.01 | 0.01 | 0.01 | 0.01 |
| Total: | 100.025 | 100.025 | 100.025 | 100.025 | 100.025 | 100.03 | 100.03 | 100.03 | 100.03 |

TABLE 2

Chemical Names

| Trade Name | Chemical Name |
|---|---|
| DER 332 | Diglycidyl ether bisphenol A homopolymer |
| ERL 4221 D | 3,4-Epoxycyclohexylmethyl 3,4-epoxycyclohexylcarboxylate |
| Uvacure 1500 | 3,4-Epoxycyclohexylmethyl 3,4-epoxycyclohexanecarboxylate |
| Heloxy 48 | Trimethylolpropane triglycidyl ether |
| Heloxy 84 | Polyglycidyl ether of an aliphatic polyol |
| Arcol LG 650 | Glycerol Poly (oxypropylene) triol (MW 260) |
| CHDM | 1,4-Cyclohexanedimethanol |
| Polymeg 1000 | Polytetramethylene ether glycol (MW 1000) |
| CN 120 | Bisphenol A Epoxy Diacrylate |
| SR 9041 | Dipentaerythritol monohydroxypentaacrylate |
| DPHA | Dipentaerythritol Hexaacrylate |
| SR 295 | Pentaerythritol tetracrylate |
| SR 355 | Ditrimethylolpropane tetraacrylate |
| SR 399 | Dipentaerythritol monohydroxypentaacrylate |
| SR 499 | Trimethylolpropane ethoxylated (6), triacrylate |
| I-184 | 1-hydroxycyclohexyl phenyl ketone |
| UVI 6976 | Mixture of $PhS\text{-}(C_6H_4)\text{-}S\text{+}Ph_2SbF_6$ and $Ph_2S\text{+-}(C_6H_4)S(C_6H_4)S\text{+}Ph_2(SbF_6\text{-})_2$ |
| Crystal Violet Lactone | 6-dimethylamino-3,3-bis(4-dimethylaminophenyl) phthalide |
| Tinuvin 144 | Bis (1,2,2,6,6-pentamethyl-4-piperidyl) [[3,5-bis(1,1-dimethylethyl)-4-hydroxyphenyl] methyl] butylmalonate |
| Tinuvin 900 | 2- (2H-Benzotriazol-2-yl) -4,6-bis(1-methyl-1-phenylethyl) phenol |
| DY 062 | N-Benzyl-N,N-dimethylamine (BDMA (Benzyl dimethyl amine)) |

Examples 1-9 were prepared by combining the components and mixing at room temperature until the solids were dissolved and the mixture was homogeneous. CN® 120 and Polymeg 1000 were heated to 80° C. to lower their viscosity and aid in handling.

Mechanical Properties

Three-dimensional articles were prepared on an SLA® 7000 machine using the following parameters:

| PARAMETER | VALUE |
|---|---|
| Minimum Support Height (inch) | 0.4 |
| Layer Thickness (inch) | 0.004 |
| Hatch Overcure (inch) | 0.000 |
| Hatch Spacing (inch) | 0.004 |
| Fill Cure Depth (inch) | 0.010 |
| Fill Spacing (inch) | 0.004 |
| Border Overcure (inch) | 0.009 |
| Resin Temperature (° C.) | 28-30 |

"Minimum Support Height" is the standard default value for the height of the support(s) on the SLA machine. The support(s) on the SLA machine is created between the SLA machine's platform and the three-dimensional article that is being built to compensate for any unevenness in the platform, to raise the article above any screw or fixture that may be protruding from the top of the platform, and to ensure easier removal of the built article.

"Layer Thickness" is the thickness of each layer of the three-dimensional article that is to be built.

"Hatch Overcure" is the depth beyond the layer thickness which is exposed during a given pass (hatch) of the laser.

"Hatch Spacing" is the distance between adjacent hatch vectors.

"Fill Cure Depth" is the absolute depth of curing for the fill vectors on a given pass of fill. Fills are tightly spaced vectors drawn on the regions of the part that form upfacing or downfacing surfaces.

"Fill Spacing" is the distance between adjacent fill vectors.

"Border Overcure" is the depth that the layer is cured past the actual thickness of the layer.

Immediately after the three-dimensional articles were imaged on the SLA® 7000 machine, they were washed in TPM for 21 minutes, rinsed with water, and dried with pressurized air in a Ramco Parts Washing System™. After drying with pressurized air, the articles were removed from their supports and placed in a PCA and an intensity of at least 320 watts of fluorescent light was delivered over 1.5 hours.

Mechanical property measurements were made on three-dimensional articles from each composition. The measurements were recorded 16-24 hours after the articles were removed from the PCA.

Optical Properties

To a round aluminum dish (2.5" diameter, 0.5" deep) was added forty grams of liquid resin. The pan containing the resin was placed in a 30° C. oven for thirty minutes to remove bubbles and equilibrate the resin to the temperature of the SLA chamber. The test article was formed on a SLA® 7000 machine by imaging a single layer with dimensions of approximately 1.3" square. The article was extended several inches on two parallel sides, giving handles that would assist in handling the part. Build parameters are provided below.

| Parameter | SLA 7000 |
|---|---|
| Minimum Support Height (inch) | NA (no supports were used) |
| Layer Thickness (inch) | 0.004 |
| Fill Cure Depth (inch) | 0.005 |
| Fill Spacing (inch) | 0.004 |
| Border Overcure (inch) | 0.009 |
| Resin Temperature (° C.) | 28-30 |
| Laser Beam | Large spot, high power, (approx. 700-800 mw) |
| Depth of Penetration (Dp) (inch) | 0.006 |
| Critical Energy (Ec) (mj/cm$^2$) | 9.0 |
| Typical Thickness (inch) | 0.020 |

After imaging, the three-dimensional article was kept in the pan for an additional 30 minutes. The article was then suspended, with its planar surface perpendicular to the ground, for 60 minutes while the uncured resin was allowed to drain. Finally, the article was placed in a PCA fitted with ten Phillips TLK 40W/05 bulbs for 20 minutes, receiving a cumulative dose of approximately two joules/cm$^2$ (524.2 mj/cm$^2$ after 5.0 minutes, measured with a IL390B Light Bug). The clarity was measured immediately after UV post-cure. Thickness of the three-dimensional article was determined by calculating the average of five separate measurements of thickness.

The yellowness index ($\Delta$) was measured following ASTM D1925 with a Byk Gardener Color Sphere Spectrophotometer, using a 25 mm aperture. Calibration and a blank (air) were run before the measurement was taken. Yellowness index ($\Delta$) is recorded from the spectrophotometer. The yellowness index/inch is calculated by dividing the yellowness index ($\Delta$) by the thickness (inches) of the three-dimensional article.

TABLE 3

Mechanical Properties

| | Example 1 (Comparative) | Example 2 | Example 3 (Comparative) | Example 4 | Example 5 | Example 6[12] | Example 7 (Comparative) | Example 8 | Example 9 |
|---|---|---|---|---|---|---|---|---|---|
| SLA type | 350 | 350 | 350 | 350 | 350 | 7000 | 7000 | 7000 | 7000 |
| Wavelength (nm) | 355 | 355 | 355 | 355 | 355 | 355 | 355 | 355 | 355 |
| Dp (mils) | 6.99 | 6.54 | 6.90 | 7.05 | 7.19 | 5.13 | | 4.54 | 5.81 |
| Ec (mJ/cm$^2$) | 9.16 | 10.78 | 8.73 | 12.07 | 14.26 | 4.43 | | 6.17 | 9.89 |
| E4 | 16.23 | 19.88 | 15.58 | 21.28 | 24.88 | 9.67 | | 14.89 | 19.69 |
| E11 | 44.17 | 57.95 | 42.95 | 57.42 | 65.88 | 37.80 | | 69.64 | 65.62 |
| Green Strength @ 10 minutes 4 mil layer thickness Hatch Overcure +4 | | 135 | | 169 | 156 | | | 93 | |
| Green strength @ 60 minutes 4 mil layer thickness Hatch Overcure +4 | | 256 | | 294 | 391 | | | 275 | |
| Flex Modulus 1.5 hr PC | 1460 | 2200 | 1422 | 1859 | 1749 | 2627 | | 2495 | |
| Tensile strength (psi) | 5737 | 5715 | 5791 | 5499 | 5383 | 7089 | | 8573 | |
| Tensile modulus (ksi) | 258 | 251 | 255 | 239 | 230 | 326 | | 386 | |
| Elong. @ Break (Avg., %) | 13.4 | 19.1 | 14.5 | 24.6 | 21.9 | 2.9 | | 5.8 | |

TABLE 3-continued

Mechanical Properties

|  | Example 1 (Comparative) | Example 2 | Example 3 (Comparative) | Example 4 | Example 5 | Example 6[2] | Example 7 (Comparative) | Example 8 | Example 9 |
|---|---|---|---|---|---|---|---|---|---|
| Elong. @ Yield (%) | 5.77 | 4.53 | 4.32 | 4.41 | 4.48 |  |  | 3.91 |  |
| Impact Resistance (foot-lb/in) | 0.86 | 0.75 | 0.84 | 0.78 | 0.72 |  |  | 0.47 |  |
| PCA for 2 hrs | 52 | 46.8 | 52.0 | 52.0 | 50.0 | 50.0 |  | 51.9 |  |
| PCA/2 hrs @ 80 C. | 65 | 84.0 | 67.0 | 71.0 | 64.0 | 89.6 |  | 93.2 |  |
| 0 day in water | 1460 | 2200 | 1422 | 1859 | 1749 | 2627 |  | 2495 |  |
| 14 days in water | 150 | 564 (16 days) | 144 | 305 | 257 | 241 |  |  |  |
| % of original | 10.3 | 25.6 | 10.1 | 16.4 | 14.7 | 9.2 |  |  |  |

[2]Example 6' is identical to Example 6 from Table 1 except that Example 6' lacks crystal violet lactone.

TABLE 4

(Optical properties)

|  | Example 6 | Example 8 | Example 7 (Comparative) | Example 9 |
|---|---|---|---|---|
| Yellowness Index | 1.46 | 1.54 | 1.61 | 1.15 |
| Thickness (inch) | 0.01994 | 0.01940 | 0.02022 | 0.01795 |
| Yellowness Index/inch | 73.2 | 79.4 | 80 | 64 |

Examples 6, 6' and 8

As presented in Table 1, the photocurable compositions of Examples 6 and 8 both contain multifunctional (meth)acrylates without hydroxyl groups (DPHA and SR® 499). As presented in Table 4, Examples 6 and 8 both exhibit a clarity value of less than 80 (i.e., 73.2 and 79.4, respectively). In addition, as presented in Table 3, Example 6, 6' and 8 display improved mechanical properties, such as high flex modulus, high heat deflection temperature, and high water resistance.

Example 9

As presented in Table 1, the photocurable composition of Example 9 contains a multifunctional (meth)acrylate without a hydroxyl group (SR® 499) and a multifunctional (meth)acrylate that contains a hydroxyl group but has a hydroxyl equivalent weight of less than 300 grams (SR® 444). As presented in Table 4, Example 9 exhibits a clarity value of less than 80 (i.e., 64).

Comparative Example 7

As presented in Table 1, the photocurable composition of Comparative Example 7 contains a multifunctional (meth)acrylate that contains a hydroxyl group and that has a hydroxyl equivalent weight greater than 500 grams (SR® 399). As presented in Table 4, Comparative Example 9 exhibits a clarity value of 80.

SR 9041 used in comparative example 1 and 3 is a multifunctional (meth)acrylate that contains a hydroxyl group and that has a hydroxyl equivalent weight greater than 500 grams.

Examples 10-15

Table 5 lists the components of each photocurable composition labeled as Examples 10-15. The numbers in Table 5 refer to the weight percent of each component based on the total weight of the photocurable composition.

TABLE 5

|  | Example 10 | Example 11 | Example 12 | Example 13 | Example 14 | Example 15 |
|---|---|---|---|---|---|---|
| Epoxides |  |  |  |  |  |  |
| DER 332 |  |  |  |  |  | 5 |
| DY 026[1] |  |  |  | 13.5 | 37.5 |  |
| Heloxy 48 | 24 | 24 | 10.7 |  |  |  |
| Heloxy 84 |  |  | 6 |  |  |  |
| Heloxy 107[2] |  |  |  | 18 |  |  |
| Uvacure 1500 | 40.2 | 40.2 | 48 | 47.25 | 30.625 | 50 |
| Polyols |  |  |  |  |  |  |
| Arcol Polyol LHT-42[3] | 6 | 6 |  |  |  | 20 |

TABLE 5-continued

|  | Example 10 | Example 11 | Example 12 | Example 13 | Example 14 | Example 15 |
|---|---|---|---|---|---|---|
| Dianol 320[4] | 8 | 8 | | | | |
| K-Flex 188[5] | | | 15 | | | |
| Phenoxy resin | | | | | | |
| PKHP 200[6] | 2 | 2 | | | | |
| Alkoxylated Acrylates | | | | | | |
| SR 415[7] | | | 6.3 | 10 | 12.5 | |
| SR 499 | 6.3 | | | | | 15 |
| SR 502[8] | | 6.3 | | | | |
| Acrylates | | | | | | |
| SR 399 | 6 | 6 | | | | 3 |
| SR 9041[9] | | | 6 | | | |
| Free Radical P.I. | | | | | | |
| Irgacure 184 | 2.5 | 2.5 | 2 | 2.25 | 2.5 | 2 |
| Cationic P.I. | | | | | | |
| Cyracure 6974[10] | 5 | 5 | 6 | 4.5 | 6.875 | |
| UVI 6976 | | | | | | 5 |
| Other | | | | | | |
| BDMA[11] | 0.01 | 0.01 | 0.012 | | | 0.02 |
| PES E6020[12] | | | | 4.5 | 10 | |
| TOTAL | 100.01 | 100.01 | 100.012 | 100 | 100 | 100.02 |
| Clarity measurement | Opaque. | Opaque. | 88.39 | Opaque | Opaque | 89.241 |

[1] 1,4-Butanediol diglycidyl ether
[2] Cyclohexanedimethanol diglycidyl ether
[3] Propoxylated glycerine, M.W. 260
[4] Propoxylated Bisphenol A
[5] Polyester polyol
[6] Polyhydroxy ether, phenoxy resin, micronized
[7] Ethoxylated (20) TMPTA
[8] Ethoxylated (6) TMPTA
[9] Dipentaerythritol monohydroxy pentaacrylate
[10] Triaryl sulfonium hexafluoro antimonate salt, mixture in propylene carbonate
[11] N-benzyl-N,N-dimethyl amine
[12] Polyether Sulfone (BASF)

What is claimed is:

1. A photocurable composition comprising:
   (a) an epoxy component containing one or more epoxy compounds with from 0 to no more than 5% of the epoxy component being a glycidyl epoxy compound;
   (b) a (meth)acrylate component containing one or more multifunctional (meth)acrylates comprising trimethylolpropane ethoxylated triacrylate and wherein the one or more methacrylates contain no hydroxyl groups and;
   (c) a component comprising propoxylated glycerine;
   (d) a cationic photoinitiator; and
   (e) a free radical photoinitiator wherein the composition contains at least about 4% by weight and at most 20% by weight of component (b) and about 0.01% to about 10% by weight of component (c) and wherein the composition after cure has a yellow index/inch value of less than 80.

2. The photocurable composition of claim 1 wherein the one or more multifunctional (meth)acrylates comprise a pentaerythritol (meth)acrylate.

3. The photocurable composition of claim 2 wherein the pentaerythritol (meth)acrylate comprises pentaerythritol triacrylate and/or pentaerythritol tetraacrylate.

4. The photocurable composition of claim 1 wherein the one or more multifunctional (meth)acrylates comprise a dipentaerythritol (meth)acrylate.

5. The photocurable composition of claim 4 wherein the dipentaerythritol (meth)acrylate is dipentaerythritol hexaacrylate.

6. The photocurable composition of claim 1 wherein component (c) has a molecular weight of 1500 or less.

7. A process for producing a three-dimensional article in sequential cross-sectional layers in accordance with a model of the article, the process comprising the steps of:
   (1) forming a first layer of the photocurable composition of claim 1;
   (2) exposing the first layer to actinic radiation in a pattern corresponding to a respective cross-sectional layer of the model sufficient to harden the first layer in the imaged area;

(3) forming a second layer of the photocurable composition of claim 1 above the hardened first layer;
(4) exposing the second layer to actinic radiation in a pattern corresponding to a respective cross-sectional layer of the model sufficient to harden the second layer in the imaged area; and
(5) repeating steps (3)-(4) to form successive layers to form the three-dimensional article.

8. A process for forming a three-dimensional article in sequential cross-sectional layers in accordance with a model of the article, the process comprising the steps of: depositing droplets of the photocurable composition of claim 1 onto a substrate in a pattern corresponding to a cross-sectional layer of the model so that adjacent droplets merge together; repeating this step to form successive layers; and applying actinic radiation to cure the photocurable composition of claim 1, pixel-by-pixel, line-by-line, layer-by-layer, after several layers have been formed and/or after all the layers have been formed to form the three-dimensional article.

9. A three-dimensional article produced according to the process of claim 7.

10. A three-dimensional article produced according to the process of claim 8.

11. A photocurable composition comprising:
(a) a cationically curable component formed from one or more epoxy compounds with from 0 to no more than 5% of the curable component being a glycidyl epoxy compound;
(b) a (meth)acrylate component comprising trimethylolpropane ethoxylated triacrylate and wherein the methacrylate component contains no hydroxyl groups;
(c) a polyol component comprising propoxylated glycerine;
(d) a cationic photoinitiator; and
(e) a free radical photoinitiator
wherein the composition contains at least about 4% by weight and at most 20% by weight of component (b) and about 0.01% to about 10% by weight of component (c) and wherein the composition after cure has a yellow index/inch value of less than 80.

12. The photocurable composition of claim 1 wherein the (meth)acrylate component comprises dipentaerythritol hexaacrylate.

13. A photocurable composition comprising:
(a) a cationically curable component formed from one or more epoxy compounds with from 0 to no more than 5% of the curable component being a glycidyl epoxy compound;
(b) a (meth)acrylate component comprising trimethylolpropane ethoxylated triacrylate and wherein the methacrylate component contains no hydroxyl groups;
(c) a polyol component comprising propoxylated glycerine;
(d) a cationic photoinitiator; and
(e) a free radical photoinitiator
wherein the composition contains at least about 4% by weight and at most 20% by weight of component (b) and about 0.01% by to about 10% by weight of component (c) and wherein the composition after cure has a yellow index/inch value of less than 80.

* * * * *